United States Patent [19]
Jensen et al.

[11] Patent Number: 5,395,718
[45] Date of Patent: Mar. 7, 1995

[54] CONFORMAL PHOTOLITHOGRAPHIC METHOD AND MASK FOR MANUFACTURING PARTS WITH PATTERNED CURVED SURFACES

[75] Inventors: David G. Jensen, Auburn; Daniel R. Tichenor, Kent, both of Wash.

[73] Assignee: The Boeing Company, Seattle, Wash.

[21] Appl. No.: 978,322

[22] Filed: Nov. 18, 1992

[51] Int. Cl.⁶ .............................................. G03F 9/00
[52] U.S. Cl. ....................................... 430/5; 430/311; 430/313; 430/323; 430/258; 343/708; 343/873; 343/909
[58] Field of Search ................... 430/5, 311, 313, 323, 430/319, 258; 343/909, 708, 873

[56] References Cited

U.S. PATENT DOCUMENTS 4,388,388 6/1983 Kornbau et al. ................... 430/5

OTHER PUBLICATIONS

Brochure entitled "Laserdyne Model 890 BeamDirector"; Laserdyne Division, Lumonics Corporation, Eden Prairie, Minn. (1990).
Brochure entitled "Laserdyne Model 780 and 780 BeamDirector"; Laserdyne Products, Lumonics Laser Systems Group, Eden Prairie, Minn. (1990).
Brochure entitled "Florod Laser Systems for Microelectronics"; Florod Corporation, Gardena, Calif. (1988).
Brochure entitled "Molded Circuit Products for a Quality Connection"; UFE Incorporated, Stillwater, Minn. (undated).
New Products, Feb. 1991, pp. 7 and 8.
Brochure from the Florod Corporation, Gardena, Calif., of the Model LFA-308 Excimer Laser Cutter (1991).

*Primary Examiner*—S. Rosasco
*Attorney, Agent, or Firm*—Joan H. Pauly

[57] ABSTRACT

Parts having complexly curved, frequency selective surfaces can be manufactured with a high degree of precision using a three-dimensional conformal mask. The mask has a transparent substrate and a patterned opaque layer on the substrate. The layer may be patterned by laser ablation. Alternatively, the patterning of the opaque layer can be accomplished by applying a layer of photosensitive material over the opaque layer and then defining temporary and permanent areas thereof. The temporary areas of the photosensitive layer and the opaque layer are removed sequentially to define the transparent portions of the mask. Parts are made by intimately mating the mask and a part body to which a layer of metal and a layer of photosensitive material have been applied, and exposing the part to radiation through the mask. The exposed part is then chemically developed, the layer of metal is etched, and the remainder of the layer of photosensitive material is removed to complete the patterning of the part body surface. The mask is preferably made using a high precision laser etch system to sharply define the transparent portions of the mask and maximize the precision of the patterning on the subsequently made parts.

17 Claims, 9 Drawing Sheets

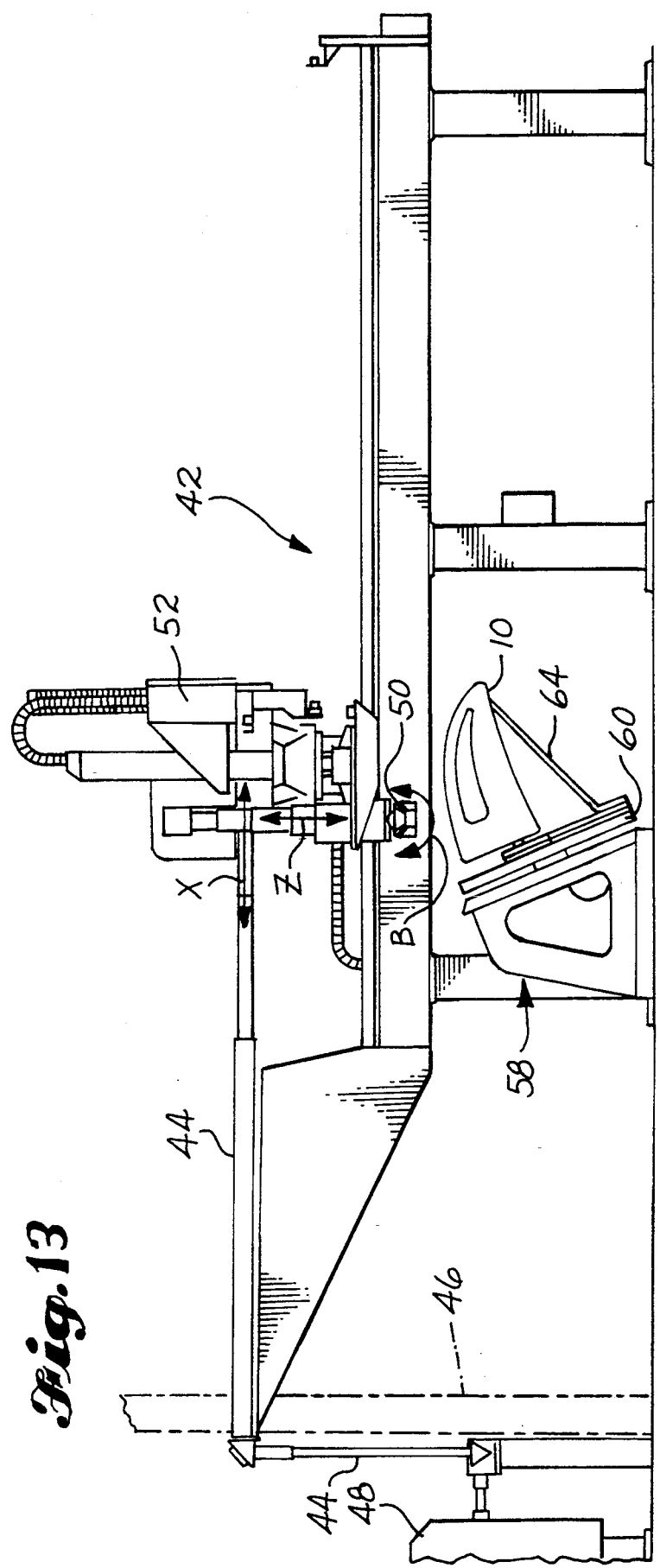

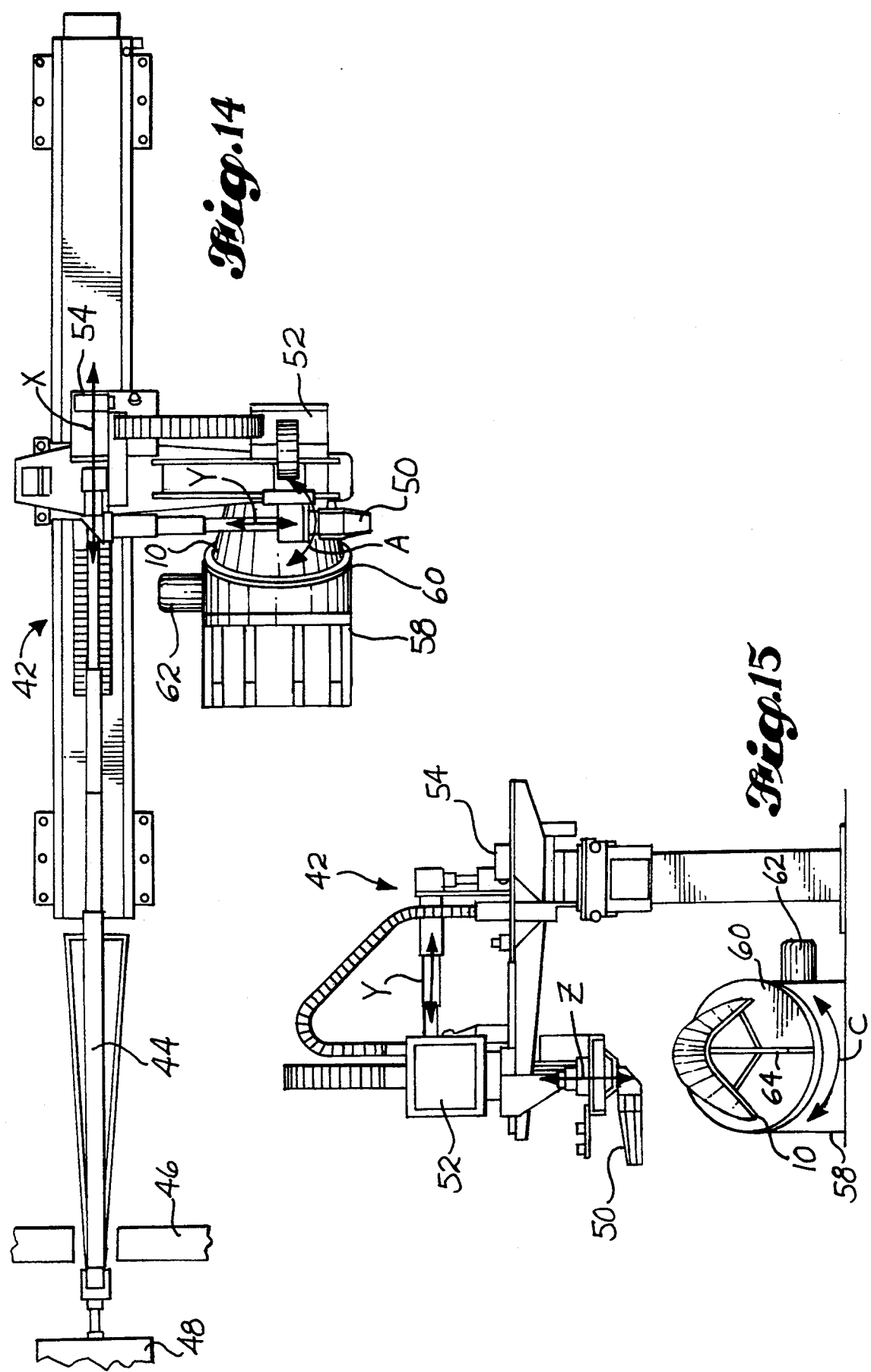

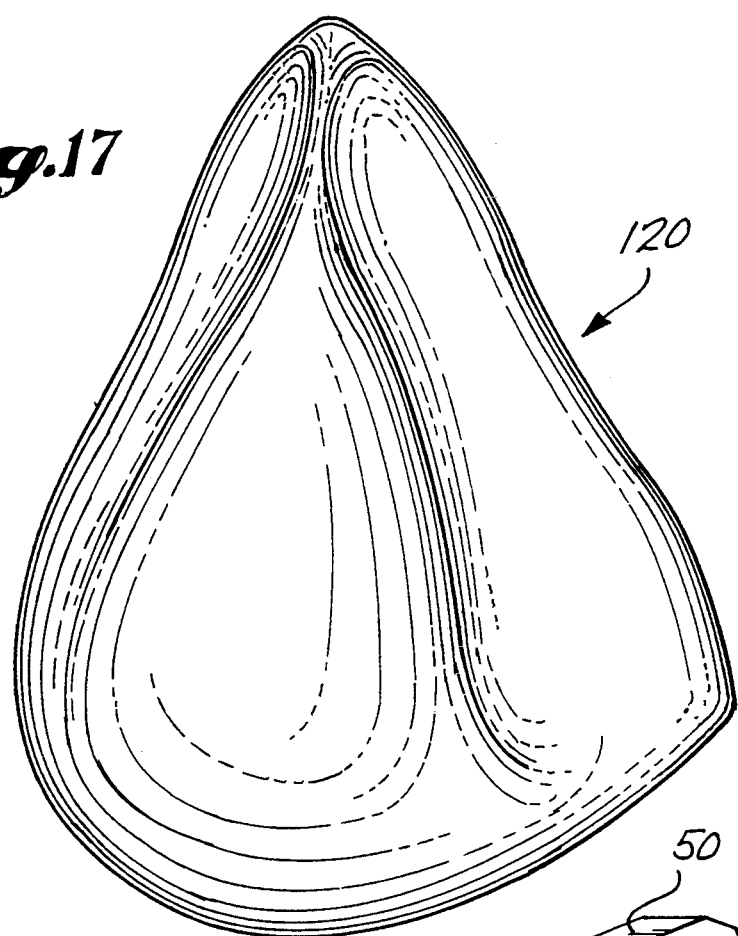
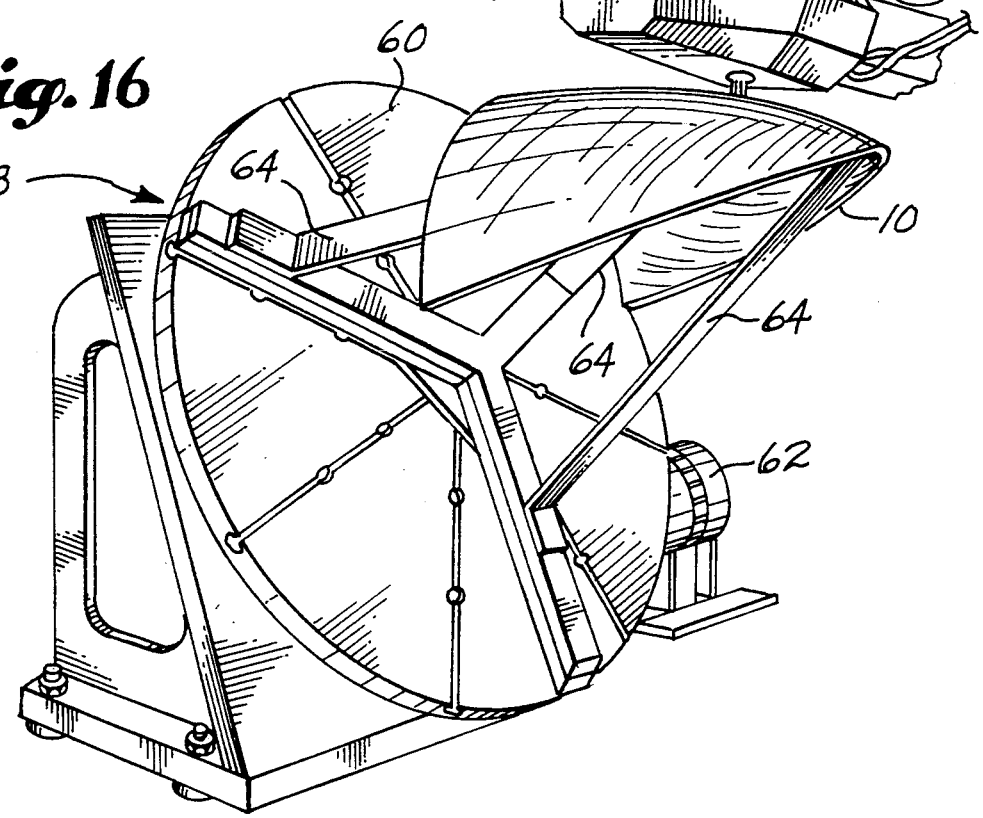

CONFORMAL PHOTOLITHOGRAPHIC METHOD AND MASK FOR MANUFACTURING PARTS WITH PATTERNED CURVED SURFACES

TECHNICAL FIELD

This invention relates to the manufacture of patterned curved surfaces and, more particularly, to a mask for forming patterns on curved surfaces using photolithography techniques, and methods of making and using the mask.

BACKGROUND INFORMATION

Frequency selective surfaces are useful in a number of applications. Such applications include radomes, canopies, and other aircraft structures and the receiving surfaces of satellite dishes. A surface may be made frequency selective by forming a pattern on the surface, for example, by applying a patterned metal layer to the surface. The accuracy of the frequency selectivity of the surface depends on the precision of the pattern formed on the surface. Any curvature in the surface complicates the pattern and makes the achievement of precise frequency selectivity extremely difficult. This is especially true in the case of complexly curved surfaces. Currently, there is no known method for patterning curved surfaces to achieve precise frequency selectivity in a cost effective manner.

One method that has been tried is splicing flat sheets of etched copper onto a complexly curved surface. This method has produced inadequate alignment of the elements of the pattern and resulting unacceptable inaccuracies in the overall pattern.

SUMMARY OF THE INVENTION

The present invention is directed toward a conformal photolithographic system that solves the problems discussed above and makes possible the efficient manufacture of parts having curved frequency selective surfaces. The system of the invention has various aspects, including a method of manufacturing parts, parts made by such method, a mask for use in manufacturing parts, and a method of manufacturing the mask. In the system, use of the mask in the manufacture of the parts is a key feature. It provides consistency in the quality and surface pattern-related characteristics of the parts, and allows the overall system to be applied in a highly cost effective manner.

A first object of the invention is to provide a method of making a part having a predetermined shape that includes a curved surface, and of forming a pattern on the surface. According to an aspect of the invention, the method comprises providing a mask having a shape complementary to the curved surface, transparent portions transparent to electromagnetic radiation with a predetermined range of frequencies, and opaque portions opaque to such radiation. The method further comprises forming a part body having said predetermined shape. A layer of metal is applied to the curved surface of the part body, and a layer of photosensitive material is applied over the layer of metal. After these layers have been applied to the part body, the mask and the part body are mated, using a vacuum bag to achieve intimate contact between the mask and the layer of photosensitive material. With the mask and the part body mated, the layer of photosensitive material is exposed through the mask to radiation having a range of frequencies within the predetermined range, to define selected areas of the layer of photosensitive material. Then, the layer of photosensitive material is chemically developed to remove it from the selected areas. The layer of metal is also removed from the selected areas.

The step of exposing the layer of photosensitive material may be carried out in various ways. Preferably, it comprises exposing the layer of photosensitive material to essentially parallel radiation. This may be accomplished, for example, by exposing the layer to a light source relatively far away from the layer through an aperture close to the layer, or by exposing the layer to radiation from a laser. The use of a distant non-laser light source is generally preferred because it allows the exposing step to be completed relatively quickly and inexpensively. As used herein, the term "essentially parallel radiation" means radiation that produces a sharp boundary between illuminated area and shadow when it is projected through an aperture. The degree of sharpness required in a particular situation depends on the required tolerances for that situation.

In the method of making the part, the mask may take various forms. In the preferred embodiments, the mask includes a substrate transparent to radiation having the predetermined range of frequencies. The transparent portions and the opaque portions are defined by a discontinuous layer, on the substrate, of material opaque to radiation having the predetermined range of frequencies. In a first preferred embodiment, the discontinuous layer comprises paint. In a second preferred embodiment, the discontinuous layer is metallic. Whatever the nature of the material forming the discontinuous layer, the configuration of the layer may vary, and as used herein, the term "discontinuous layer" includes a layer comprising a plurality of separate unconnected elements, a layer comprising a plurality of elements at least some of which touch each other, and a layer having a continuous background interrupted by holes in the layer.

Another object of the invention is to provide a part made by the above-described method.

Still another object of the invention is to provide a method of making a mask for use in forming a pattern on a plurality of curved surfaces of a predetermined shape. According to an aspect of the invention, the method comprises forming a substrate from a material transparent to electromagnetic radiation with a predetermined range of frequencies. The substrate has a shape complementary to the predetermined shape. A layer of material opaque to radiation with the predetermined range of frequencies is applied to the substrate. Essentially parallel electromagnetic radiation is used to define temporary areas and permanent areas of the layer, and the temporary areas of the layer are removed while leaving the permanent areas. The material forming the layer may, for example, comprise paint or be metallic. The temporary areas of either of these two types of opaque material layers may be simultaneously defined and removed by laser ablation.

In the case of a metallic layer, an alternative procedure is to apply a second layer of material over the metallic layer before defining the temporary and permanent areas. The second layer comprises photosensitive material. The step of defining the temporary and permanent areas comprises subjecting portions of the second layer to essentially parallel electromagnetic radiation. These portions of the second layer may be laser ablated. Alternatively, these portions may be laser cured. As used herein, the term "laser cured" in reference to a material means that the material is subjected to a laser to change the material's molecular structure to thereby change the material's solubility in a chemical.

A fourth object of the invention is to provide a mask for use in forming a pattern on a plurality of curved surfaces. The mask is preferably made in accordance with the method described above. According to an apparatus aspect of the invention, the mask is designed for forming a pattern on a plurality of complexly curved surfaces. The mask comprises a substrate which is transparent to electromagnetic radiation with a predetermined range of frequencies and which has a shape complementary to the complexly curved surfaces. The mask further comprises a discontinuous layer, on the substrate, of material opaque to such radiation. The layer defines transparent portions of the mask transparent to such radiation and opaque portions of the mask opaque to such radiation, to define the pattern. As noted above, the discontinuous layer may be formed from various materials, such as paint or metal.

The mask of the invention is suitable for forming a wide variety of patterns. In one embodiment of the mask, the pattern comprises a multiplicity of substantially identical elements that are repeated throughout the pattern. The transparent portions and the opaque portions define the elements with some of the elements rotated to compensate for curvature. The elements per se may be either transparent or opaque. The term "substantially identical" is intended to be understood as including elements with essentially the same shape and the same or different sizes and the same or different orientations. The sizes of the elements may vary by a factor of two or more. The elements may be touching or separated from each other. In another embodiment of the mask, the transparent and opaque portions define a circuit.

The present invention solves the problem of the need for a cost effective system for manufacturing a number of essentially identical frequency selective surfaces that meet precise performance requirements. In the system of the invention, the patterning of even complexly curved surfaces to give the surfaces precise frequency selective characteristics can be accomplished at a reasonable cost. The use of a mask in the system of the invention allows the precision of the patterning to be built into the mask so that the manufacture of each patterned part requires relatively little labor and time. The method of the invention has sufficient versatility and flexibility so that virtually any required degree of precision can be accomplished. Preferred features of the invention that serve to help maximize precision are the use of a laser in the manufacture of the mask and/or the parts. By making possible the manufacture of complexly curved surfaces with highly precisioned frequency selective patterns thereon, the invention in turn allows much greater freedom in the design of the structures into which the surfaces are to be incorporated. For example, surfaces which in the past have had a relatively flattened configuration in order to accomplish the desired frequency selectivity can, by use of the invention, be made with more highly curved configurations to meet other performance requirements while preserving the frequency selectivity.

These and other advantages and features will become apparent from the detailed description of the best modes for carrying out the invention that follows.

BRIEF DESCRIPTION OF THE DRAWINGS

In the drawings, like element designations refer to like parts throughout, and:

FIG. 13 is a side elevational view of a preferred embodiment of the apparatus for carrying out the laser etching steps of the invention.

FIG. 14 is a top plan view of the apparatus shown in FIG. 13.

FIG. 15 is an end elevational view of the apparatus shown in FIGS. 13 and 14.

FIG. 16 is a pictorial view of the mask support fixture shown in FIGS. 13-15, illustrating the laser etching procedure.

FIG. 17 is a pictorial view of a complexly curved part body that may be patterned in accordance with the invention.

BEST MODE FOR CARRYING OUT THE INVENTION

Figure 8:
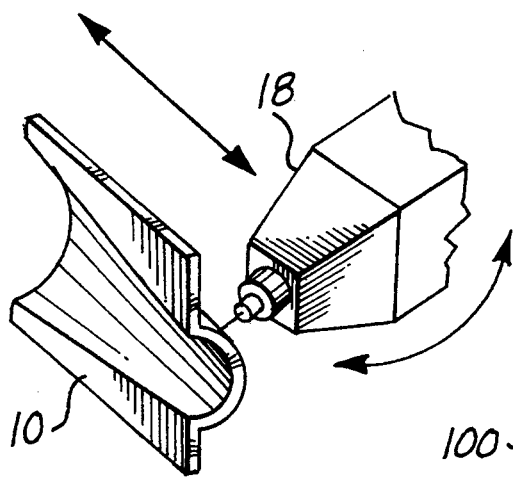
FIG. 8 is a pictorial view illustrating laser etching of the mask.
Figure 9:
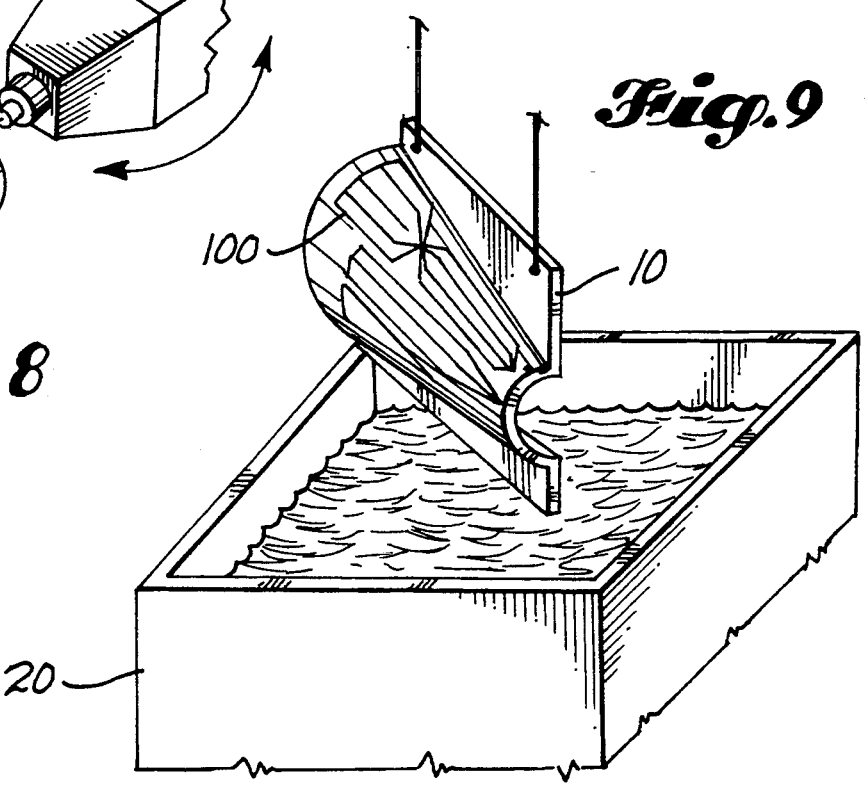
FIG. 9 is a pictorial view illustrating the etched mask being lowered into a processing bath.
Figure 12:
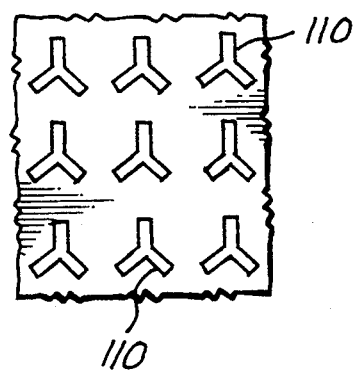
FIG. 12 is a plan view illustrating a typical repeating pattern formed on a part in accordance with the invention.

The drawings illustrate the best modes for carrying out the methods and apparatus of the invention currently known to the applicants. FIGS. 9 and 12 illustrate two patterns that may be formed on parts in accordance with the invention. The illustrated patterns are a circuit 100 and a pattern of repeating identical elements 110, respectively. These are only two examples of the many different types of patterns that may be formed in accordance with the invention. The invention may also be used to form patterns representing different types of circuits and different repeating elements and also other types of patterns. The shape of the surface on which the pattern is formed and the shape of the mask may also be varied considerably without departing from the spirit and scope of the invention. The surface may be concave or convex and may have simple or complex curvature. FIGS. 4-11 and FIGS. 13-16 and 17 illustrate, respectively, only two examples of the many possible surface configurations.

The invention encompasses a number of aspects which make up a system for manufacturing parts having patterned curved surfaces. The system includes a three-dimensional conformal mask for use in the manufacture of the parts, a method of making the parts, and a method of making the mask. Currently, it is anticipated that the system of the invention will be used primarily in connection with the manufacture of parts having frequency selective surfaces and that the surfaces will generally have a pattern of repeating elements, such as the pattern shown in FIG. 12. This type of frequency selective surface may be used, for example, to provide an aircraft canopy or radome with electromagnetic shielding. Another possible application of the system of the invention is in the manufacture of curved circuit boards. Such boards may be advantageous in environments where there is limited space. For example, a generally frusto-conical circuit board could be positioned along the inner sidewall of a nose cone of a rocket to minimize its impact on the space available in the rocket.

In accordance with the invention, the method of making a part is carried out using a mask. The mask is used to form a pattern on a curved surface of the part. The mask has a shape complementary to the curved surface and transparent portions and opaque portions. The transparent portions are transparent to electromagnetic radiation with a predetermined range of frequencies, and the opaque portions are opaque to such radiation. The portions of the mask need be transparent or opaque only with respect to the predetermined range of frequencies. This range is determined by the frequencies to which the part will be subjected during the later steps of the method. Generally, the transparency or opaqueness of the mask portions to other frequencies is of no importance. Exceptions to this general rule include situations in which the mask is subjected during its manufacture to a type of laser which necessitates a particular type of opaqueness or transparency in order to avoid damage to the mask substrate.

The transparent portions and opaque portions of the mask may be formed in various ways. Preferably, the mask includes a substrate transparent to radiation having the predetermined range of frequencies, and the transparent portions and opaque portions are defined by a discontinuous layer, on the substrate, of material opaque to such radiation. As used herein, "discontinuous layer" has the broad meaning set forth above. For example, referring to FIG. 12, the opaque material could constitute the background with each of the elements 110 constituting a discontinuity in the layer. Alternatively, the layer might consist of the elements 110 with the background surrounding the elements 110 forming the discontinuity. Similarly, the circuit pattern shown in FIG. 9 might have as its opaque layer either the circuit elements or the background around the elements.

The opaque material forming the discontinuous layer may be of various types. In the preferred embodiments of the invention, the layer is either metallic or comprises paint. A particular example of a type of paint that has been found to be suitable is gray alkyd enamel paint.

Figure 1:
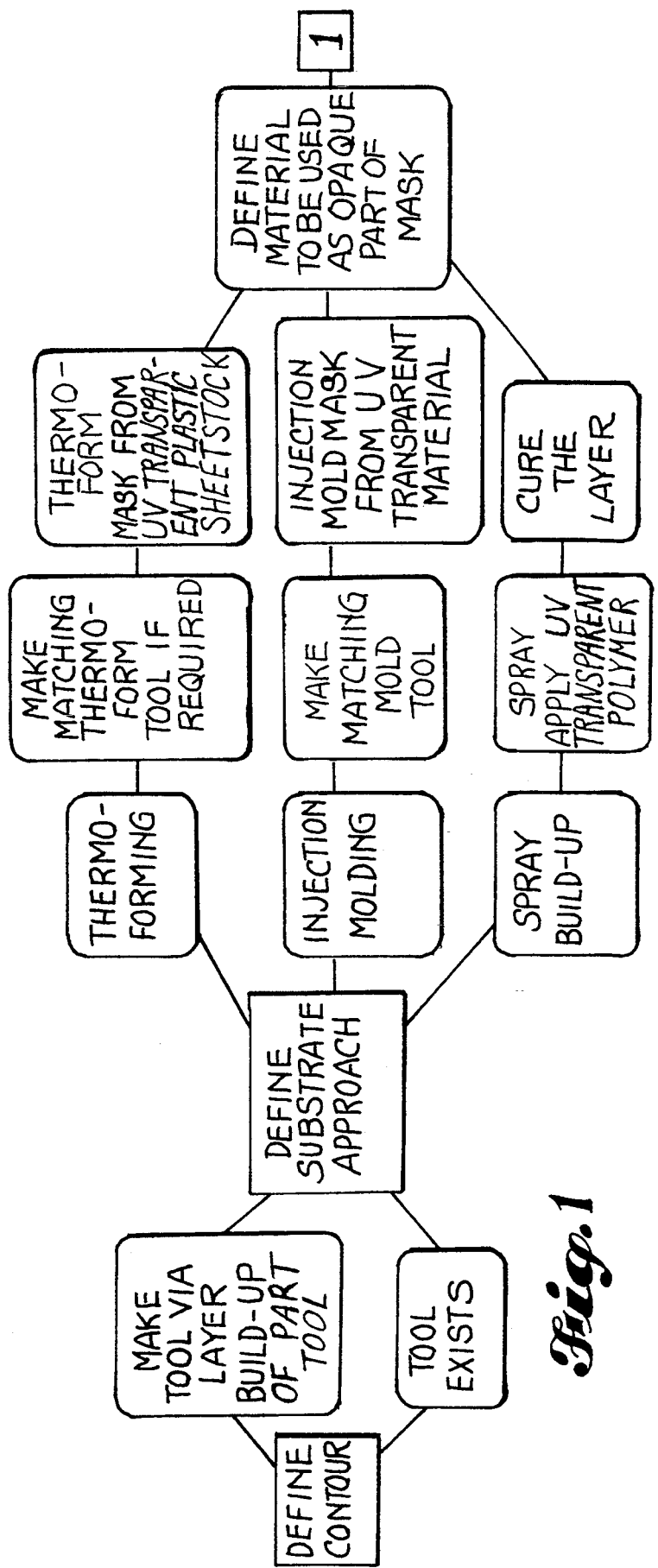
FIGS. 1 and 2 are together a flow chart of the preferred embodiments of the method of making the mask of the invention.
Figure 2:
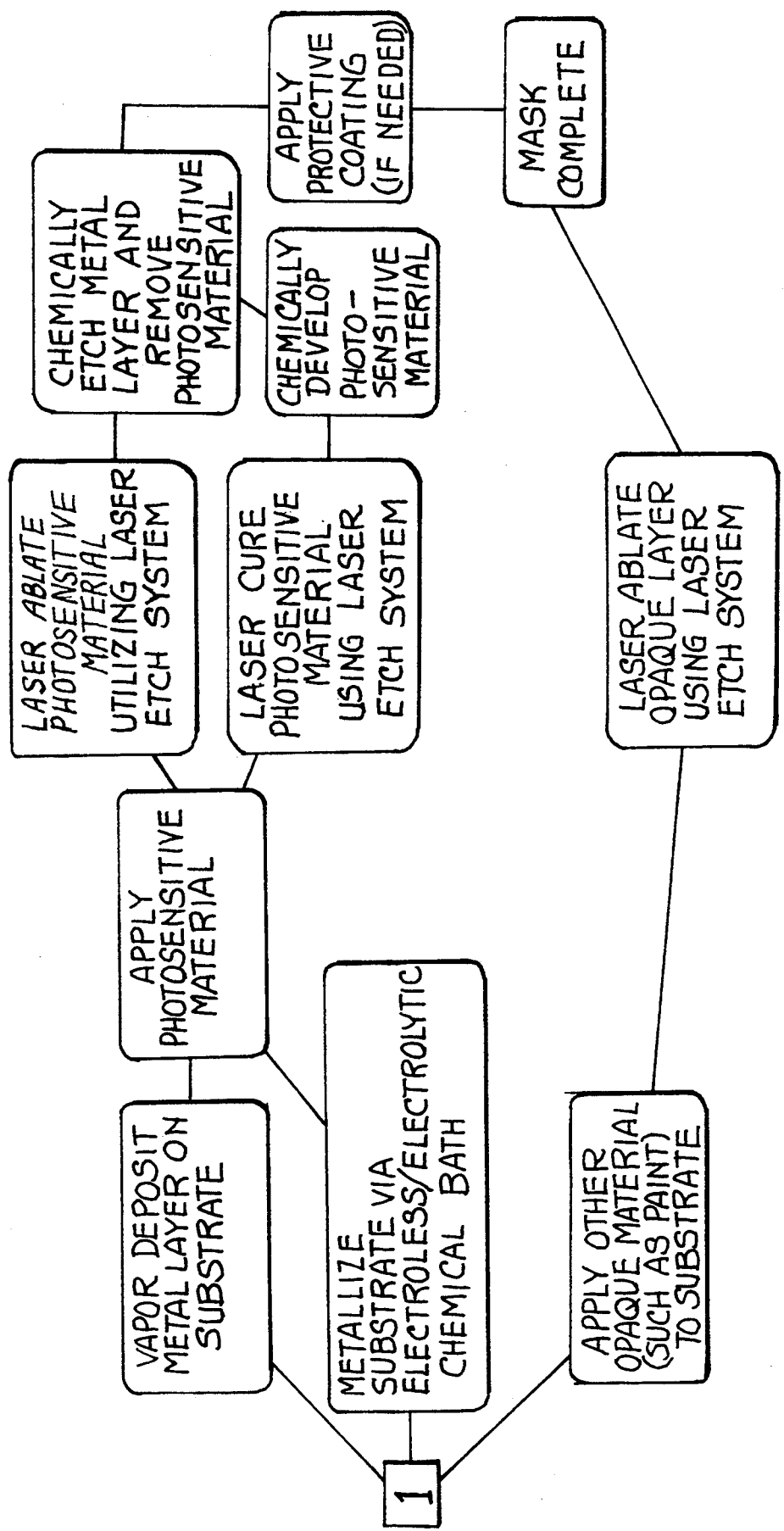

The preferred embodiments of the method of making the mask are shown in the flow charts in FIGS. 1 and 2. FIG. 1 illustrates the manufacture of the mask substrate. The first step is to define the contour of the mask. This is determined on the basis of the configuration of the curved surface on which a pattern is to be formed using the mask. The mask contour is complementary to the curved part surface to allow intimate contact between the mask and the part during the manufacture of the part. The mask substrate is formed to have the desired contour. In this context, the term "form" has its broadest meaning and includes machining, spray and layer build-up, various molding procedures, such as injection molding and thermoforming, and other procedures for creating a desired configuration. As shown in FIG. 1, the substrate is preferably formed by thermoforming, injection molding, or spray build-up. Each of these procedures requires a tool on or against which the substrate is formed. Injection molding also requires a matching tool. Thermoforming can be accomplished in a number of ways, including using a matching tool, vacuum bagging over a male tool, and using a vacuum to draw material into a female tool. In the manufacture of the substrate, the required tool or tools may already be available, for example from the manufacture of a previous mask, or the tool may be created as a part of the mask manufacturing method. The tool that defines the mask surface that will mate with the parts being manufactured is preferably made by building up a tool for the manufacture of the part itself. The build-up is necessary in order to obtain a complementary mask surface. The tool build-up may be carried out by means of fiberglass layer build-up. The techniques for building up a tool in this manner are known.

Figure 4:
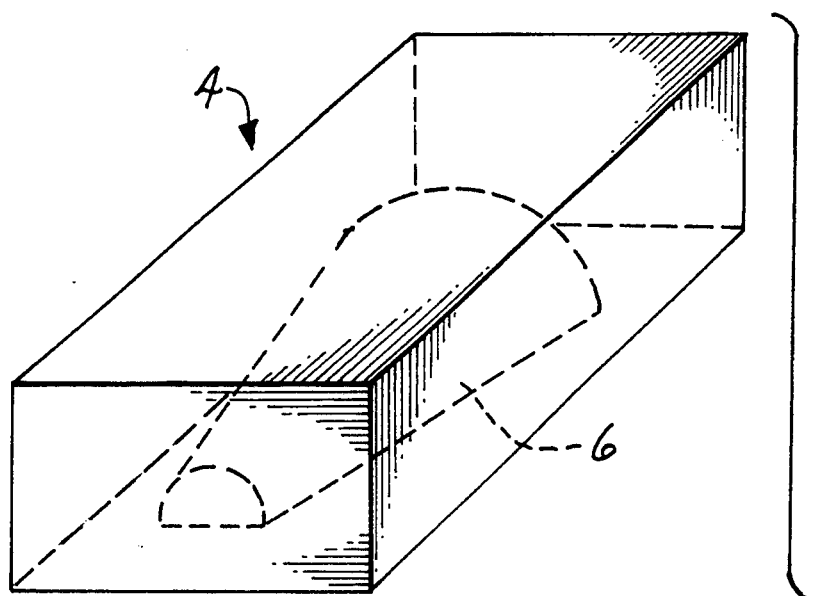
FIG. 4 is an exploded pictorial view of apparatus for forming the mask substrate, simplified for the purposes of illustration.
Figure 4:
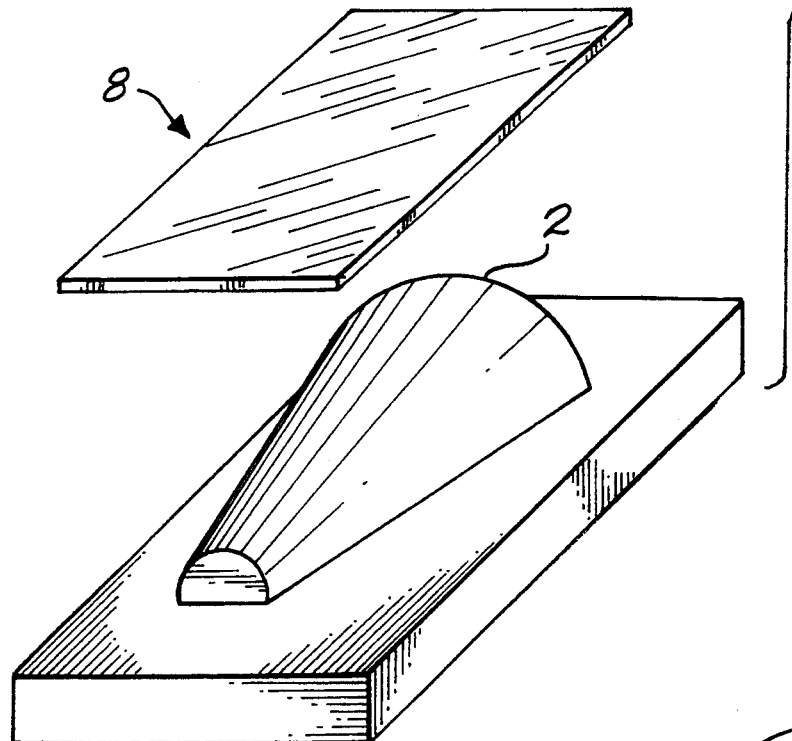
Figure 5:
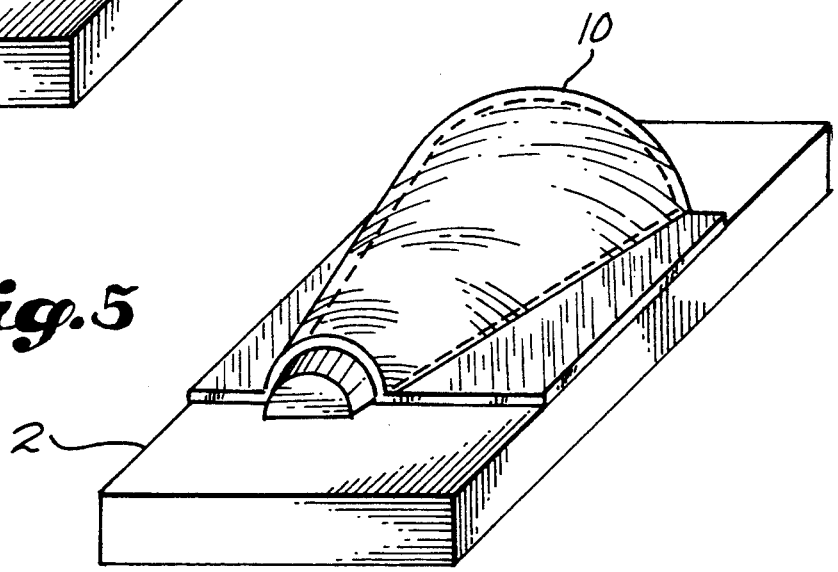
FIG. 5 is a pictorial view of the lower tool shown in FIG. 4 with the mask substrate formed thereon.

After the required tool or tools have been acquired or made, the actual forming of the substrate can be carried out. FIG. 1 illustrates three alternative ways of carrying out the forming procedure. The upper portion of FIG. 1 illustrates the currently most preferred method of forming the substrate. This method is thermoforming and is also illustrated in FIGS. 4 and 5. The thermoforming is carried out using the built-up tool 2 and a matching tool 4 with a cavity 6. The thermoforming is accomplished by release coating the tool parts 2, 4 and bringing the two tool parts 2, 4 together to form the thermally softened plastic sheet stock 8 therebetween in a known manner. FIG. 5 shows the formed substrate 10 following the thermoforming. The plastic sheet stock 8 is transparent to electromagnetic radiation with a predetermined range of frequencies. For example, the sheet stock 8 may be a material transparent to ultraviolet radiation, as indicated in FIG. 1. Examples of such materials include polymethyl methacrylate, which is sold under the trademark "Plexiglas" and which is currently the preferred material, and polycarbonate, which is a plastic sold under the trademark "Lexan". Another possible example is PETG (polyethylene terephthlate glycol). This material is not conventionally used as an ultraviolet transparent material, but the applicants believe it has sufficient transparency so that a PETG mask substrate will not break down before a reasonable number of parts are made. The factors governing the choice of the material include thermoformability, degree of transparency, dimensional stability, and ability to achieve adhesion to the subsequently applied opaque layer.

One of the alternative substrate forming procedures illustrated in FIG. 1 is injection molding. This is accomplished using matching tools and injecting material, such as a relatively ultraviolet transparent material like PETG, into the mold cavity defined by the tools. This procedure is preferred when the curved surface is such that there would be excessive plastic stretch in a thermoforming procedure. The other alternative procedure shown in FIG. 1 is spray build-up. In this procedure, a polymer, such as an ultraviolet transparent polymer, is spray applied to the built-up tool. Following the spray application, the polymer is cured. Another possible alternative for the substrate is a layer build-up of a material such as glass reinforced resin.

Once the substrate has been formed by thermoforming, injection molding, or spray application and curing, the procedure for creating the opaque portions of the mask may be carried out. As indicated in FIG. 1, the first step is to choose the material that is to be used to form the opaque portions. FIG. 2 illustrates the steps of the method of manufacturing the mask following the forming of the substrate and the selection of the opaque material. In each of the preferred embodiments of this portion of the method, an opaque layer, i.e. a layer of material opaque to the predetermined range of frequencies, is applied to the substrate. The layer is applied in a manner that gives it a uniform thickness. Then, essentially parallel electromagnetic radiation is used to define temporary areas and permanent areas of the opaque layer. This is done by delivering focused collimated radiation normal to the surface of the opaque layer. The temporary areas of the layer are removed, and the permanent areas are left, to complete the mask.

Figure 7:
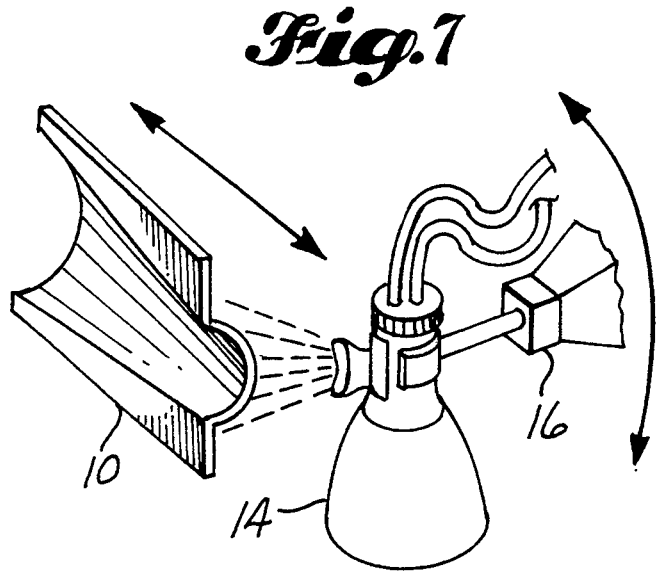
FIG. 7 is a pictorial view illustrating application of the photosensitive layer to the metalized substrate using a robotically operated sprayer.

As shown in FIG. 2, the opaque material in the preferred embodiments is either metallic or comprises another opaque material, such as paint. In the currently most preferred embodiment, illustrated at the bottom of FIG. 2, the opaque material comprises paint. Paint is the preferred approach because it appears to be more durable than metallic layers, and the manufacture of the mask is simplified by the use of paint. The application of the paint to the substrate 10 may be carried out in a number of ways. For example, the paint may be spray applied by means of a sprayer 14 operated by a robot 16. FIG. 7 illustrates this method of applying a layer. Once the paint has been applied and has dried, the temporary and permanent areas of the paint layer are defined. This is preferably done simultaneously with the removal of the temporary areas by means of laser ablation. FIG. 8 illustrates a laser head 18 being used to subject the opaque layer on the substrate 10 to laser radiation. In the illustrated embodiments with an ultraviolet transparent substrate 10, the opaque layer is subjected to a high power ultraviolet laser. Following the laser ablation of the temporary areas of the paint layer, the mask is complete.

Figure 6:
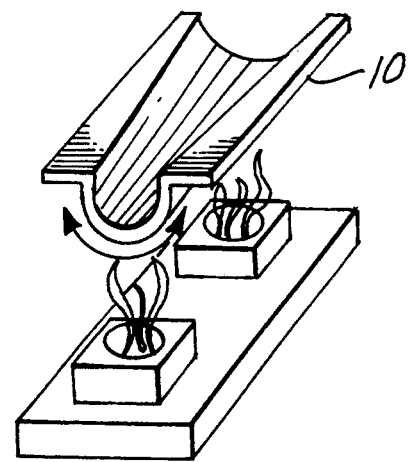
FIG. 6 is a pictorial view illustrating vapor deposition of the metal layer on the mask substrate.

The upper portions of FIG. 2 illustrate the alternative methods of forming the opaque and transparent portions of the mask using a metalized layer to define the opaque portions of the mask. The opaque metal layer may be vapor deposited on the substrate 10 using, for example, E-beam evaporation, as illustrated in FIG. 6. The other alternative for applying the metal layer shown in FIG. 2 is metalizing the mask substrate 10 via an electroless/electrolytic chemical bath. Sputtering is still another alternative. After the metal layer has been applied, a uniform layer of photosensitive material is applied over the metal layer. This second layer may be applied in various ways but is preferably spray-applied, as illustrated in FIG. 7. Other application techniques that may be suitable are spin and dip coating. The suitability of these techniques depends on their capability to produce an even coating, which in turn depends primarily on the size and geometry of the substrate. As used herein, the term "photosensitive" means that the material is sensitive, chemically, electrically, or otherwise, to the action of radiant energy. The material need only be sensitive to the range of frequencies to which it will be subjected during the later steps of the method.

After the layer of photosensitive material has been applied, portions of this layer are subjected to electromagnetic radiation to define temporary areas and permanent areas thereof and thereby define temporary and permanent areas of the opaque layer. In order to accomplish sharp definition between the opaque and transparent portions of the completed mask, the radiation is preferably essentially parallel, and even more preferably radiation from a laser. FIG. 8 illustrates the use of a laser. As shown in FIG. 2, the laser may be used either to cure or ablate portions of the photosensitive layer. In the case of laser curing, the laser is used to render the temporary areas soluble in a chemical development solution or to render the permanent areas insoluble. If the photosensitive material is a negative photoresist, i.e. exposure to the laser makes it become insoluble, the permanent areas are exposed to the laser. In the case of a photosensitive material that is a positive photoresist, the temporary areas are exposed to the laser to render them soluble.

Following the laser curing, the coated substrate is subjected to a solution to chemically develop it, i.e. remove the soluble temporary areas of the photosensitive material. The mask is then subjected to a chemical solution to etch the metal layer in the temporary areas while leaving the metal in the permanent areas to define the opaque portions of the mask. After the metal has been etched, the remainder of the photosensitive material is removed. In some situations, the mask is then complete. However, it is sometimes desirable to apply a protective coating over the now discontinuous metal layer. FIG. 9 illustrates the mask being lowered into a processing bath 20, which may contain a development chemical, an etching chemical, or a chemical for removing the remaining photosensitive material. The mask could be subjected to each of these types of chemicals by means other than a bath. For example, the chemical could be sprayed onto the mask.

Instead of laser curing, laser ablation may be employed to define and remove the temporary areas of the photosensitive material. Since this accomplishes the defining and removing simultaneously, the chemical development step is eliminated. Other than the elimination of the development step, the procedure following laser ablation of the photosensitive material is the same as that following laser curing.

Regardless of which embodiment of the step(s) of defining and removing the temporary areas of the opaque layer is employed, the step(s) may include preferred features to adjust the pattern to compensate for the curvature of the patterned surface. For example, in the case of a pattern of repeating elements, such as the pattern illustrated in FIG. 12, the curvature frequently distorts the pattern. To prevent such distortion from adversely affecting the performance of parts subsequently manufactured using the mask, the defining step preferably comprises rotating some of the elements of the pattern to compensate for the curvature. Another technique for compensating for part configuration is to vary the size of the individual elements.

The above-described method of manufacturing the mask may of course be varied without departing from the spirit and scope of the invention. One variation is to subject the mask to essentially parallel electromagnetic radiation to define the temporary and permanent areas of the opaque layer by means other than a laser. For example, the mask may be subjected to a light source that is relatively far away from the mask surface through an aperture close to the surface in order to achieve the desired essentially parallel radiation. Light radiation projected in this manner is essentially parallel, within the contemplation of the invention, if the edge of the aperture defines a sharp shadow. The use of a non-laser source of essentially parallel radiation has the potential advantage of making areas of the mask surface that a laser head cannot reach accessible to the radiation. However, a laser is generally preferred because it produces a greater degree of sharpness in the definition of the opaque portions of the mask and a resulting greater accuracy in the patterning of parts subsequently made using the mask. The accuracy of the mask is preferably maximized by using a precision laser etch system, such as the five-axis gantry 42 shown in FIGS. 13–16 and described below.

Another variation of the making of the mask that is not shown in FIG. 2 is the direct laser ablation of the metal layer to simultaneously define the remove the temporary areas of the metal layer. This procedure dispenses with the need for the application and removal of a photosensitive material over the metal layer. However, the procedure also has some drawbacks. The metal layer is preferably very thin so that the laser ablation will result in very distinct and clean edges defining the boundaries of the ablated areas. In order to achieve this, a maximum thickness of about 0.15 microns is desirable. A metallic coating this thin is subject to damage. Therefore, a protective coating would be desirable in the finished mask. The drawback of a protective coating is that it can affect the sharpness of the edges in the subsequently manufactured parts. In contrast, an opaque layer of paint having a greater maximum thickness of, for example, 12.5 microns, can be laser ablated with resulting sharp, very well defined edges. Since paint is more durable than a very thin metal layer, no subsequent protective coating is needed (although one may be used). Omitting the protective coating helps achieve a greater precision in the manufacture of the parts. In addition, the procedures using paint are relatively simple and inexpensive to carry out. The paint can be sprayed onto the substrate, whereas the metal must be deposited by means of more complicated and expensive procedures, such as vapor deposition and electroless/electrolytic coating.

The order of the steps may also be varied. For example, the opaque layer could be applied to the substrate before the substrate is formed. It might also be possible to pattern the layer before forming the substrate. The acceptability of these variations in a particular circumstance depends largely on the degree of curvature of the formed surface and the allowed tolerances of the parts to be made using the mask.

In each of the embodiments of the method of manufacturing the mask described above, the substrate is formed first and then the layer of opaque material is applied to the substrate. An alternative procedure within the scope of the invention is to form the layer or layers of material and the structural substrate as a stack-up on the built-up tool. This approach is more difficult to carry out than the substrate forming and subsequent layer applying procedure. However, it has the advantage of having fewer inherent limitations, such as the limitations that are inherent in molding procedures.

In the stack-up procedure, the required tool(s) are obtained or built-up, as described above. A release of a known type is applied to the tool surface on which the mask is to be formed. A thin layer of opaque material, such as a layer of metal or a layer of paint, is applied uniformly over the release coated tool surface. The opaque layer may be applied to the tool in the various ways that it may be applied to the mask substrate in the preferred embodiments. These include spraying and spin coating, in the case of paint, and vapor deposition, sputtering, and electroless/electrolytic coating, in the case of a metallic material. The major limitation on the application procedure is that it must apply the layer essentially uniformly over the tool surface. If the opaque layer is to be laser ablated, the next step in the manufacture of the mask is to laser ablate the temporary portions of the opaque layer. Following the ablation, a uniform layer of structural material is applied over the laser ablated discontinuous opaque layer. The structural material forms the substrate of the mask and is transparent to the predetermined frequency range. The selection of the substrate material is made on the basis of a number of factors, including degree of transparency, ease of application, ability to adhere to the remaining opaque material, and tendency to release from the exposed release treated built-up tool surface. After the structural material has been applied and formed over the tool, the structural material and discontinuous opaque layer are removed as a unit from the tool. The mask is then complete except for the protective coating, if one is required.

If the opaque layer is not ablated directly, the step following the application of the opaque layer over the tool surface is the application of a uniform thickness of photosensitive material over the metallic layer. This layer may be spray, spin, or dip coated. The choice of the particular application technique depends, at least in part, on the nature of the material being applied and the degree of contour of the tool surface. Following its application, the layer of photosensitive material is subjected to radiation to cure it or laser ablate it, and the subsequent steps of chemical development and chemical etch are carried out, as necessary, as described above. Following the removal of the remaining photosensitive material, the uniform layer of structural material is applied as in the case of direct laser ablation of the opaque layer.

Figure 3:
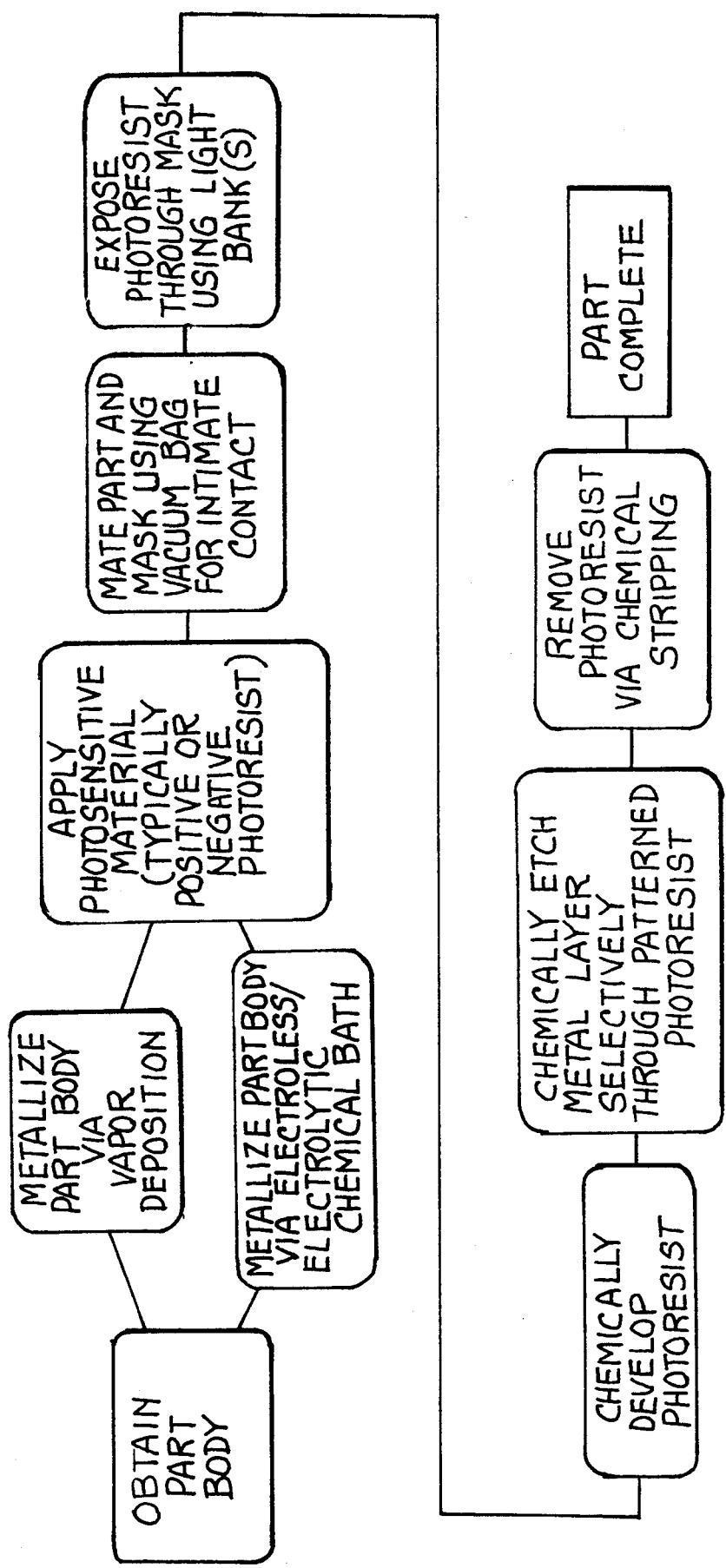
FIG. 3 is a flow chart of the preferred embodiments of the method of making parts using the mask.
Figure 10:
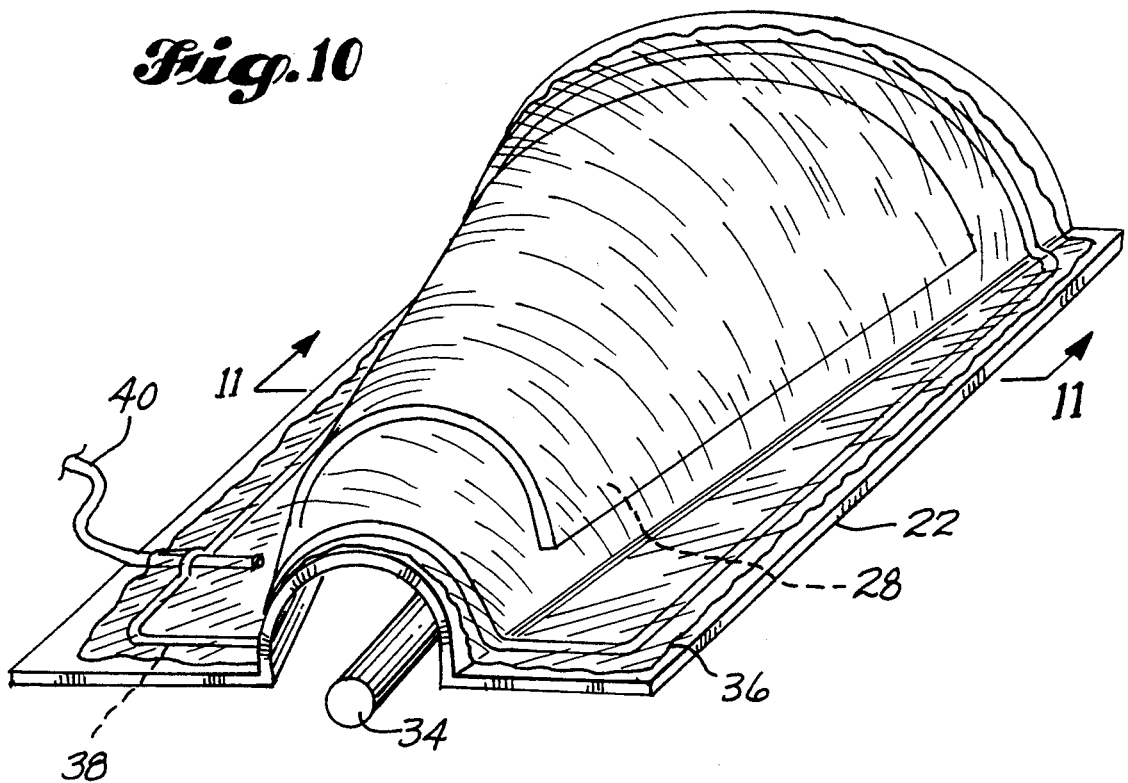
FIG. 10 is a pictorial view illustrating exposure of a part to light through the completed mask.
Figure 11:
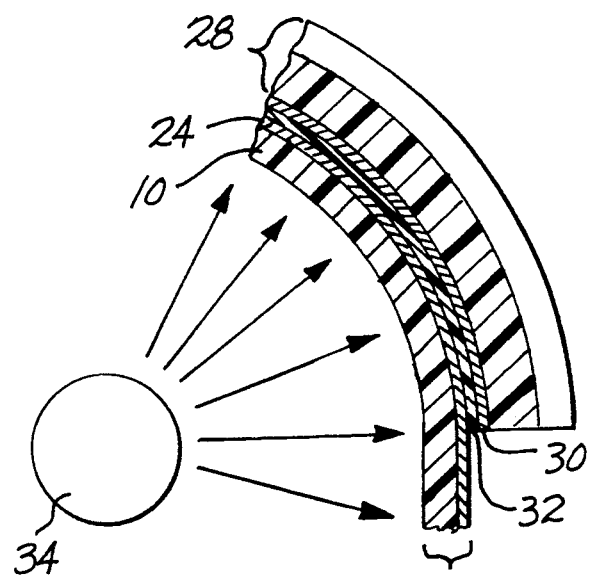
FIG. 11 is a sectional view taken along the line 11—11 in FIG. 10, with the vacuum bagging film omitted.

Once the mask has been completed, it may be used to pattern the curved surfaces of a plurality of parts. It is currently contemplated that the preferred embodiment of the mask with the painted opaque portions will be usable for making 100 or more parts before it must be replaced because of wear. The completed mask 22 is illustrated in FIGS. 10 and 11. It includes the substrate 10 and the discontinuous (patterned) opaque layer 24. The method of making the parts encompasses both the making of the mask and the making of the parts themselves, including the use of the mask to pattern the part surfaces. FIG. 3 illustrates the steps following the fabrication of the mask.

Referring to FIG. 3, the making of the part comprises forming a part body having a desired predetermined shape. As in the case of the mask substrate, the term "forming" has its broadest meaning in relation to the part body. The part body may be formed from various materials, such as an organic resin composite, which may be a dielectric, or some other dielectric. After the part body has been formed or a preformed part body has been obtained, a layer of metal is applied to the curved surface of the part body which is to be patterned. The metal may be applied in a number of ways, as described above in connection with the mask. The preferred application techniques shown in FIG. 3 are metalizing via vapor deposition (e.g. copper) and metalizing via an electroless/electrolytic bath. In both cases, the subsequent steps are the same and have the goal of patterning the metallic layer on the part body. This goal is accomplished using photolithographic techniques and the mask of the invention. Still referring to FIG. 3, a layer of photosensitive material is applied over the layer of metal. The photosensitive layer may be applied in any of the ways discussed above in connection with the fabrication of the mask. FIG. 11 illustrates the part body 28 with its metallic and photosensitive layers 30, 32 applied thereto.

When the application of the layers 30, 32 has been completed, the part body 28 is mated with the corresponding curved mask surface, as illustrated in FIGS. 10 and 11. A vacuum bag, such as the transparent vacuum bagging film 36 shown in FIG. 10, is used to achieve intimate contact between the mask 22 and the layer 32 of photosensitive material on the part body 28 and thereby ensure a sharp image on the part surface. The bag 36 is drawn tightly over the part body 28 and the mask 22 by means of a vacuum line 40. The evacuated area is sealed in a known manner by a vacuum sealant 38. The layer of photosensitive material 32 on the part body 28 is exposed to radiation having a range of frequencies within the predetermined range through the mask 22 while the mask 22 and part 28 are intimately mated. As shown in FIG. 10, the bag 36 and the source of radiation 34 are on opposite sides of the mated part body 28 and mask 22. Therefore, the bag 36 need not be transparent. In a situation in which the bag and radiation source are on the same side, i.e. the radiation must go through the bag to reach the mask, the bag must be transparent to the predetermined range of frequencies.

The exposure of the layer 32 defines selected areas of the layer 32. The photosensitive material 32 is typically either a positive photoresist or a negative photoresist, i.e. its solubility is affected by exposure to radiation. If the material 32 is a positive photoresist, the areas of the layer 32 corresponding to the portions of the metal layer 30 that are to be etched are exposed to the radiation. In the case of a negative photoresist, the areas which are not to be etched are exposed. Following the exposure of the photosensitive layer 32 through the mask 22, the mask 22 is removed, the layer 32 is chemically developed to remove the soluble portions of the layer 32, the exposed portions of the metal layer 30 are chemically etched through the patterned photoresist 32, and then the remaining photoresist 32 is removed by chemical stripping to complete the part.

In the manufacture of the mask and the parts, a number of factors contribute to the accuracy of the patterning on the parts. These factors include the intimate contact between the mask and the part discussed above. They also include the thinness and evenness of the coatings and the mask substrate and the orienting of the laser to be normal to the surface being processed. With regard to coating thicknesses, the photosensitive layers on the mask substrate (where applicable) and the part body should not exceed about 0.001 inch.

As shown in FIGS. 10 and 11, the photosensitive layer 32 is exposed by means of a light source 34. Preferably the light source 34 delivers essentially parallel radiation, as defined above, to maximize the sharpness of the patterning on the completed part. In the most preferred embodiment, the photosensitive layer 32 is exposed to radiation from a mercury vapor lamp.

FIG. 17 illustrates a complexly curved configuration 120 that may be precisely patterned by use of the method of the invention. The example configuration 120 shown in FIG. 17 is only one of a wide variety of different possible configurations. Other possible configurations that may be patterned by use of a single mask include, for example, complete frustoconical surfaces. In some circumstances, the configuration of the completed part is such that it is not possible to use a single mask to pattern the entire surface. In such case, the surface may be patterned using two or more masks. The masks mate at predetermined junctures and may have mating flanges for securing them together. A major drawback of this approach is that the juncture lines must be positioned so that the inaccuracies they create in the patterning do not result in unacceptable degradation of the desired performance characteristics of the parts. A variation of the multiple mask approach is to have two masks that are sequentially applied to the surface and that have overlapping portions. This modified approach eliminates interruptions in the patterning along juncture lines but is still very difficult to carry out without some deviation in the patterning.

As noted above, the laser etching (curing or ablating) portions of the method of making the mask are preferably carried out using a precise laser etch system. An example of such a system is shown in FIGS. 13-16. The system includes a five-axis laser gantry 42 for positioning an end effector 50 that carries the laser projection optics. When positioned correctly, the optics project the laser beam substantially normal to the target point on the surface. The five axes of the gantry 42 include the X, Y, and Z translational axes and the rotational axes A, B illustrated in FIGS. 13-15. In the system, a laser beam is transmitted from a laser source 48 via a beam tube 44 that extends through a wall 46 to the end effector 50 and includes mirrors to direct the laser beam. Fiber optics could also be used in place of the beam tube 44. The positioning of the end effector 50 relative to the mask substrate 10 is accomplished by means of movement along and about the five axes. An interferometer 54 provides laser interferometer feedback to verify the translational positioning along the X, Y, and Z axes to a very high degree of accuracy. The accuracy of positioning on the gantry rotational axes may be verified by use of positioning encoders. A vision inspection system 52 is also provided. This system 52 is used primarily to verify that an element of the pattern has been correctly treated before the end effector 50 and/or the substrate 10 are moved for defining further elements of the pattern.

The end effector 50 includes laser focusing lenses and an aperture. The aperture has the shape of the elements to be etched on the mask surface. For example, with reference to the pattern shown in FIG. 12, the aperture would have the shape of one or a plurality of the individual elements 110. The aperture is carried by an aperture holder that is movable along two translational axes and about a rotational axis to provide precise micropositioning of the aperture and the resulting laser beam. The translational and rotational axes are orthogonal. The rotational axis is colinear with the laser beam to permit the pattern elements to be rotated to compensate for curvature, as described above. The end effector 50 further includes a laser diode height gauge system to ensure the proper focal distance. Out of tolerance focal distance is automatically corrected by manipulation of pertinent robot axes. The end effector 50 preferably also includes a light operated (LED) proximity sensor to automatically trigger shut-down of the laser and robot if the end effector 50 is too close to the substrate 10. FIGS. 13 and 15 show the end effector 50 in a raised nonuse position. FIG. 16 illustrates the use position in which the end effector 50 is typically about two inches above the surface being etched.

The laser etch system includes, in addition to the gantry 42, a workpiece support fixture 58 for supporting the mask substrate 10 being patterned, as best seen in FIG. 16. The fixture 58 includes a turntable 60 on which the substrate 10 is mounted by means of support struts 64. The fixture 58 adds an additional axis to the overall system for relative positioning of the mask substrate 10 and the end effector 50. This is the rotational axis C of the turntable 60 indicated in FIG. 15. An actuator 62 provides the rotation of the turntable 60. The accuracy of the positioning of the turntable is preferably verified by a laser encoder.

As mentioned above, the laser itself is preferably an ultraviolet laser. However, other types of lasers may also be used if they provide sufficient sharpness of the boundaries of the etched areas and do not damage the substrate. Different lasers may require changes in the materials used in manufacturing the mask and the parts. For example, a short pulsed $CO_2$ laser may be suitable in some applications. This type of laser would require an opaque material sensitive to the $CO_2$ laser and probably a mask substrate that is transparent to infrared radiation as well as ultraviolet radiation. The ultraviolet transparency would still be required to maintain compatibility with the part manufacturing process.

The installation of the laser etch system apparatus must be accomplished with precision and continually monitored to maintain the precision of the patterning of the mask. The etching procedure is controlled by a preprepared program that constantly adjusts itself in response to feedback from monitoring devices regarding actual operating conditions. The gantry 42 and support fixture 58 are mounted on a vibration free foundation and are located in a carefully controlled environment. Temperature, humidity, and barometric pressure are continually monitored. Compensation feedback regarding these parameters is fed to the control system, which automatically adjusts to variations. The entire system shown in FIGS. 13–16 is calibrated with a look-up table. The table takes into account a number of imperfections in the system, such as imperfections in the gantry supports.

The invention permits the rapid and accurate manufacture of parts on short notice as they are needed. The mask of the invention can be manufactured before the parts are needed. This transfers the risk of production delays due to, for example, machine failure from part manufacture to mask manufacture. The transfer of the risk prevents such delays from affecting the ability to produce parts as needed. In addition, inspection and quality control of the mask can be accomplished at the time the mask is manufactured. This greatly simplifies the inspection of the parts since verifying the accuracy of the mask is at least a partial verifying of the accuracy of the parts made with the mask.

It will be obvious to those skilled in the art to which this invention is addressed that the invention may be used to advantage in a variety of situations. Therefore, it is also to be understood by those skilled in the art that various modifications and omissions in form and detail may be made without departing from the spirit and scope of the invention as defined by the following claims.

What is claimed is:

1. A method of making a part having a predetermined shape that includes a curved surface, and of forming a pattern on said surface, comprising:
    making a mask having a shape complementary to said curved surface, transparent portions transparent to electromagnetic radiation with a predetermined range of frequencies, and opaque portions opaque to said radiation; including forming a mask substrate having said complementary shape, and, after forming said substrate, defining said transparent portions and said opaque portions by delivering collimated radiation substantially normal to selected areas of said curved surface of said substrate;
    forming a part body having said predetermined shape;
    applying a layer of metal to said curved surface of said part body;
    applying a layer of photosensitive material over said layer of metal;
    after applying said layers to said part body, mating said mask and said part body;
    with said mask and said part body mated, exposing said layer of photosensitive material through said mask to radiation having a range of frequencies within said predetermined range, to define selected areas of said layer of photosensitive material;
    then, chemically developing said layer of photosensitive material to remove it from said selected areas; and
    removing said layer of metal from said selected areas.

2. The method of claim 1, in which the step of exposing said layer of photosensitive material comprises exposing said layer of photosensitive material to essentially parallel radiation.

3. The method of claim 1, in which the step of exposing said layer of photosensitive material comprises exposing said layer of photosensitive material to radiation from a laser.

4. The method of claim 1, further comprising forming at least one additional part body having said predetermined shape; and, using said additional part body, repeating the steps of applying said layers of metal and photosensitive material, mating said mask and said additional part body, exposing said layer of photosensitive material, chemically developing, and removing said layer of metal from said selected areas, to make an additional part.

5. A method of making a part having a predetermined shape that includes a curved surface, and of forming a pattern on said surface, comprising:
    making a mask by forming, from material transparent to electromagnetic radiation with a predetermined range of frequencies, a substrate having a shape complementary to said curved surface; applying to said formed substrate an opaque layer of material opaque to said radiation; and delivering essentially parallel electromagnetic radiation substantially normal to selected portions of an outer surface of said layer to define temporary areas and permanent areas of said layer, and removing said temporary areas of said layer while leaving said permanent areas of said layer, to complete said mask;
    forming a part body having said predetermined shape;

applying a layer of metal to said curved surface of said part body;

applying a layer of photosensitive material over said layer of metal;

after applying said layers to said part body, mating said mask and said part body;

with said mask and said part body mated, exposing said layer of photosensitive material through said mask to radiation having a range of frequencies within said predetermined range, to define selected areas of said layer of photosensitive material;

then, chemically developing said layer of photosensitive material to remove it from said selected areas; and removing said layer of metal from said selected areas.

6. The method of claim 5, in which the step of exposing said layer of photosensitive material comprises exposing said layer of photosensitive material to essentially parallel radiation.

7. The method of claim 5, in which the step of exposing said layer of photosensitive material comprises exposing said layer of photosensitive material to radiation from a laser.

8. The method of claim 5, in which said opaque layer is metallic.

9. The method of claim 5, in which said opaque layer comprises paint.

10. The method of claim 5, in which said opaque layer comprises paint, and said temporary areas are simultaneously defined and removed by laser ablation.

11. The method of claim 5, in which said opaque layer is metallic; which comprises, before defining said temporary and permanent areas, applying a second layer of material over said opaque layer, said second layer comprising photosensitive material; and in which the step of defining said temporary and permanent areas comprises subjecting portions of said second layer to essentially parallel electromagnetic radiation.

12. The method of claim 11, comprising laser ablating said portions of said second layer.

13. The method of claim 11, comprising laser curing said portions of said second layer.

14. The method of claim 5, in which said pattern comprises a multiplicity of substantially identical elements that are repeated throughout the pattern; and the step of defining said temporary and permanent areas comprises rotating some of said elements to compensate for curvature.

15. The method of claim 5, further comprising forming at least one additional part body having said predetermined shape; and, using said additional part body, repeating the steps of applying said layers of metal and photosensitive material, mating said mask and said additional part body, exposing said layer of photosensitive material, chemically developing, and removing said layer of metal from said selected areas, to make an additional part.

16. A method for making a patterned part having a predetermined curvature, comprising the steps of:

(a) making a patterned mask by forming a substrate having a shape complementary to said predetermined curvature; applying to said formed substrate an opaque layer of material; and delivering essentially parallel electromagnetic radiation substantially normal to selected portions of an outer surface of said layer to define temporary areas and permanent areas of said layer, and removing said temporary areas of said layer while leaving said permanent areas of said layer, to complete the mask;

(b) forming a part body from a selected material, the body having predetermined curvature;

(c) applying a metalized coating over the body on at least one side;

(d) applying photosensitive material over the coating on at least one side;

(e) mating the patterned mask over the photosensitive material, said temporary areas corresponding to areas on the metalized coating where the metal is to be removed to form a pattern, the mask having at least a portion of the pattern on a portion corresponding to the curvature of the part body;

(f) exposing the photosensitive material through the patterned mask;

(g) removing the mask;

(h) removing the exposed photosensitive material to leave patterned photosensitive material;

(i) removing areas of the metalized coating corresponding to the pattern prepared in the photosensitive material; and (j) removing the unexposed photosensitive material to yield a part surface having a patterned metalized coating on at least one side.

17. The method of claim 16, wherein the patterned mask is recovered for reuse.

* * * * *

UNITED STATES PATENT AND TRADEMARK OFFICE
CERTIFICATE OF CORRECTION

PATENT NO. : 5,395,718
DATED : March 7, 1995
INVENTOR(S) : David G. Jensen and Daniel R. Tichenor It is certified that error appears in the above-identified patent and that said Letters Patent is hereby corrected as shown below:

Claim 16, column 16, line 24, after "having", insert -- said --.

Signed and Sealed this

Fifth Day of September, 1995

Attest:

BRUCE LEHMAN

Attesting Officer

Commissioner of Patents and Trademarks